United States Patent
Chen et al.

(10) Patent No.: US 6,542,407 B1
(45) Date of Patent: Apr. 1, 2003

(54) TECHNIQUES OF RECOVERING DATA FROM MEMORY CELLS AFFECTED BY FIELD COUPLING WITH ADJACENT MEMORY CELLS

(75) Inventors: Jian Chen, San Jose, CA (US); Long C. Pham, San Jose, CA (US); Alexander K. Mak, Los Altos, CA (US)

(73) Assignee: SanDisk Corporation, Sunnyvale, CA (US)

(*) Notice: Subject to any disclaimer, the term of this patent is extended or adjusted under 35 U.S.C. 154(b) by 0 days.

(21) Appl. No.: 10/052,759

(22) Filed: Jan. 18, 2002

(51) Int. Cl.[7] .............................................. G11C 16/00
(52) U.S. Cl. ........................ 365/185.17; 365/185.09; 365/185.03
(58) Field of Search ..................... 365/185.17, 185.04, 365/185.09, 185.22, 228, 185.03

(56) References Cited

U.S. PATENT DOCUMENTS

| 5,095,344 A | 3/1992 | Harari ........................ 257/328 |
| 5,172,338 A | 12/1992 | Mehrotra et al. ...... 365/189.07 |
| 5,172,338 A | 12/1992 | Mehrotra et al. ...... 365/185.03 |
| 5,430,859 A | 7/1995 | Norman et al. ............. 711/103 |
| 5,570,315 A | 10/1996 | Tanaka et al. ......... 365/185.22 |
| 5,574,684 A * | 11/1996 | Tomoeda ................ 365/185.04 |
| 5,579,259 A | 11/1996 | Samachisa et al. .... 365/185.14 |
| 5,602,987 A | 2/1997 | Harari et al. ................ 365/200 |
| 5,657,332 A | 8/1997 | Auclair et al. ......... 365/189.07 |
| 5,663,901 A | 9/1997 | Wallace et al. ................ 365/52 |
| 5,712,180 A | 1/1998 | Guterman et al. ............ 437/43 |
| 5,774,397 A | 6/1998 | Endoh et al. .......... 365/185.19 |
| 5,867,429 A | 2/1999 | Chen et al. ............ 365/185.33 |
| 5,890,192 A | 3/1999 | Lee et al. .................... 711/203 |
| 6,046,935 A | 4/2000 | Takeuchi et al. ....... 365/185.03 |
| 6,091,633 A | 7/2000 | Cernea et al. ......... 365/185.13 |
| 6,103,573 A | 8/2000 | Harari et al. ................ 438/257 |
| 6,151,248 A | 11/2000 | Harari et al. .......... 365/185.14 |
| 6,266,273 B1 * | 7/2001 | Conley et al. ......... 365/185.09 |
| 6,341,085 B1 * | 1/2002 | Yamagami et al. .... 365/185.09 |

* cited by examiner

Primary Examiner—Tan T. Nguyen
(74) Attorney, Agent, or Firm—Skjerven Morrill LLP

(57) ABSTRACT

Techniques of overcoming a degradation of the apparent charge levels stored in one row of memory cells as a result of subsequently programming an adjacent row of memory cells. After storing the data of the subsequently programmed row elsewhere, the charge levels of its cells are driven to common level. The charge levels of the first row of cells then have a uniform influence from the charge levels of the second row, and, as a result, the chance of successfully reading the data stored in the first row is significantly increased.

23 Claims, 5 Drawing Sheets

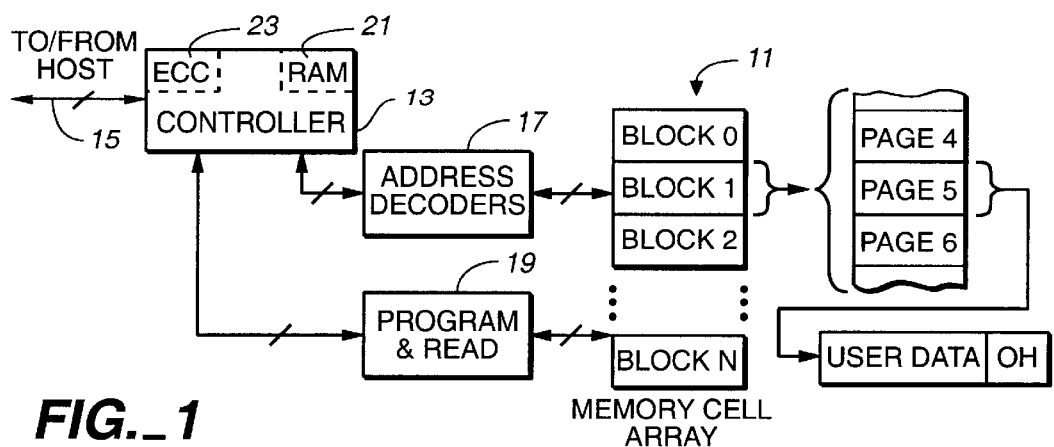
FIG._1
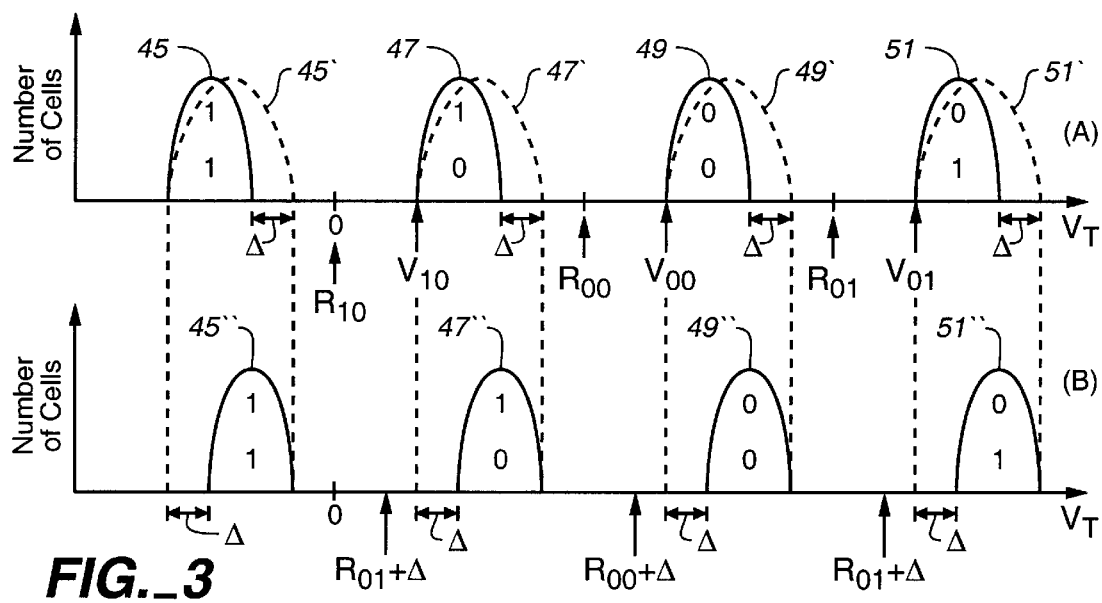
FIG._3
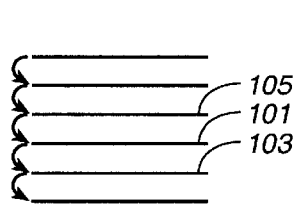
FIG._5A
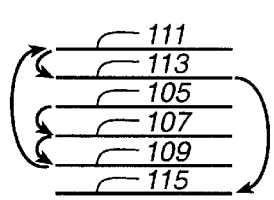
FIG._5B
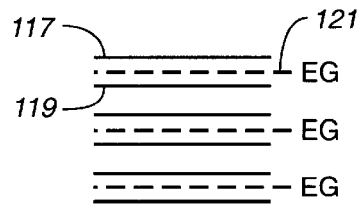
FIG._5C

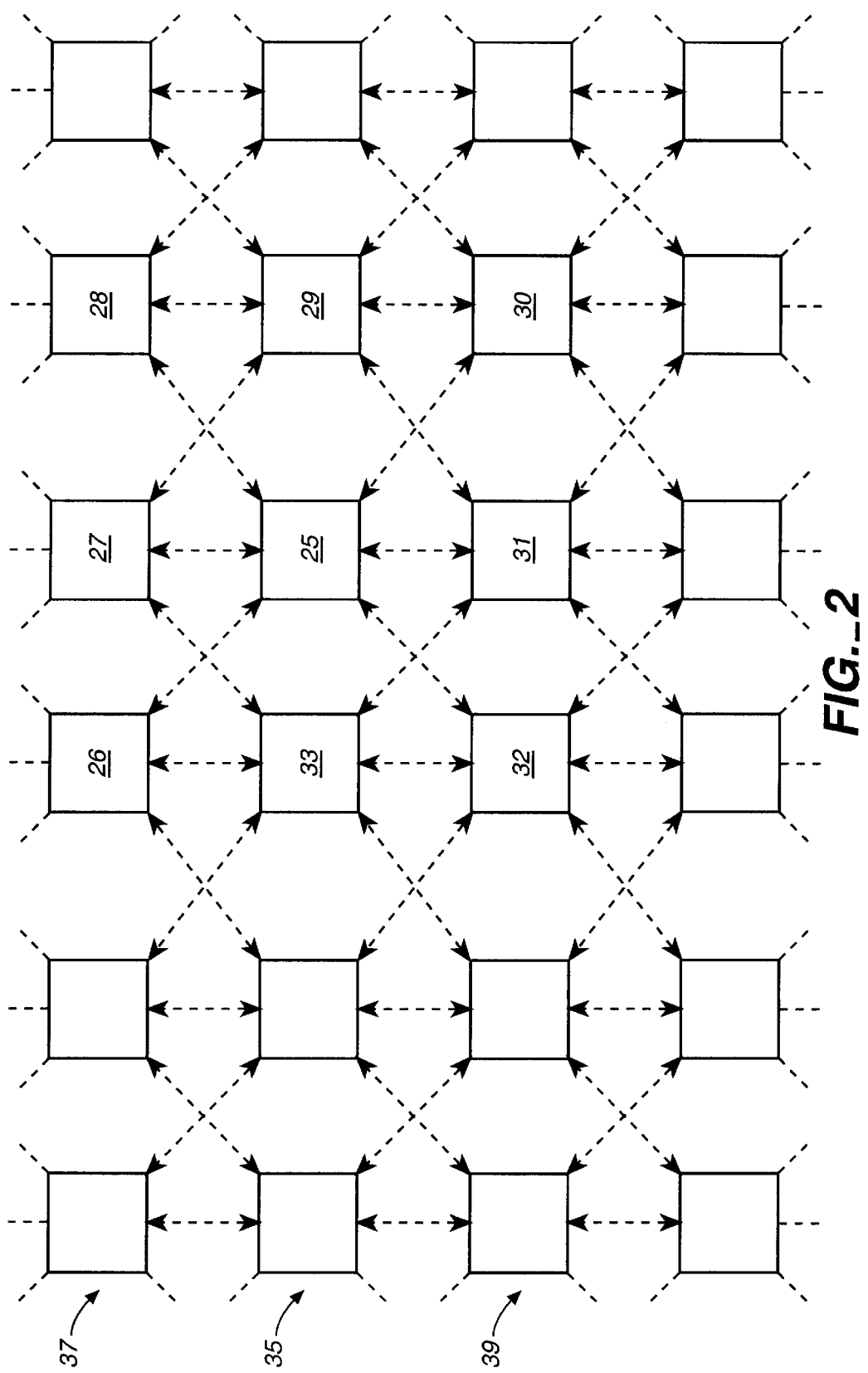
FIG._2

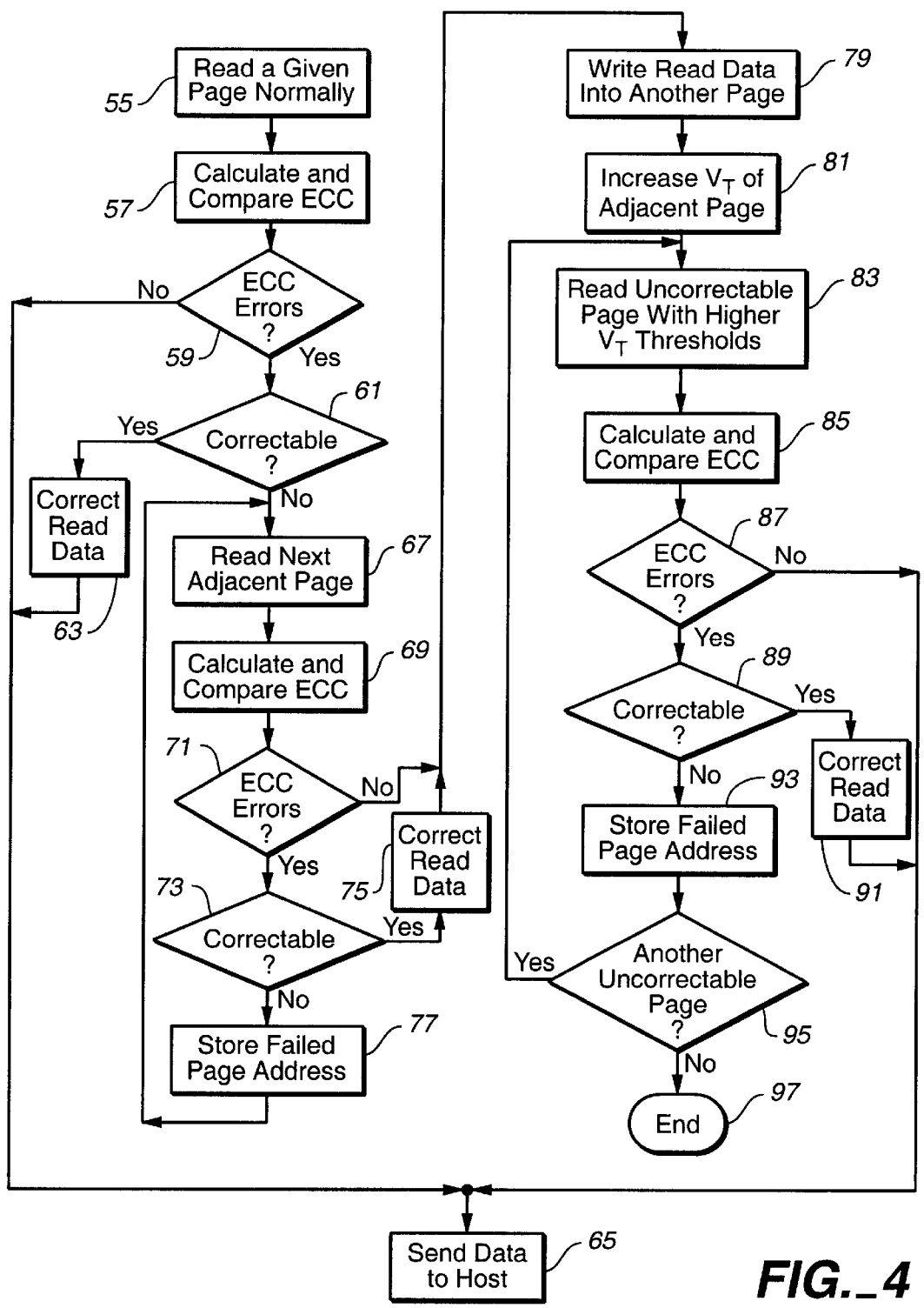
FIG._4

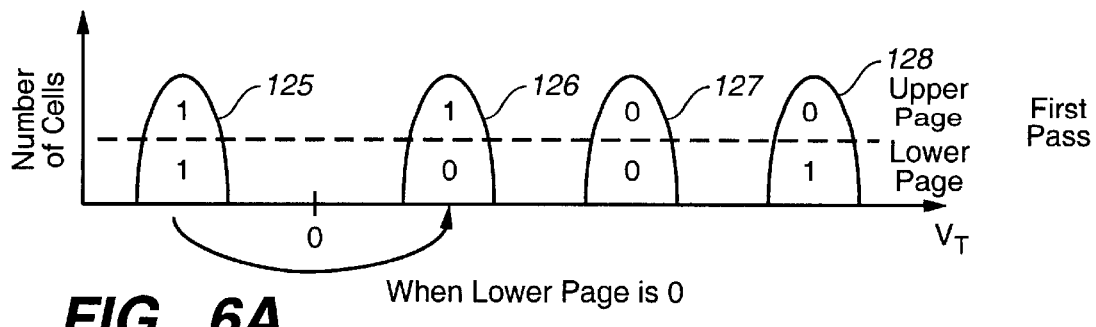
FIG._6A
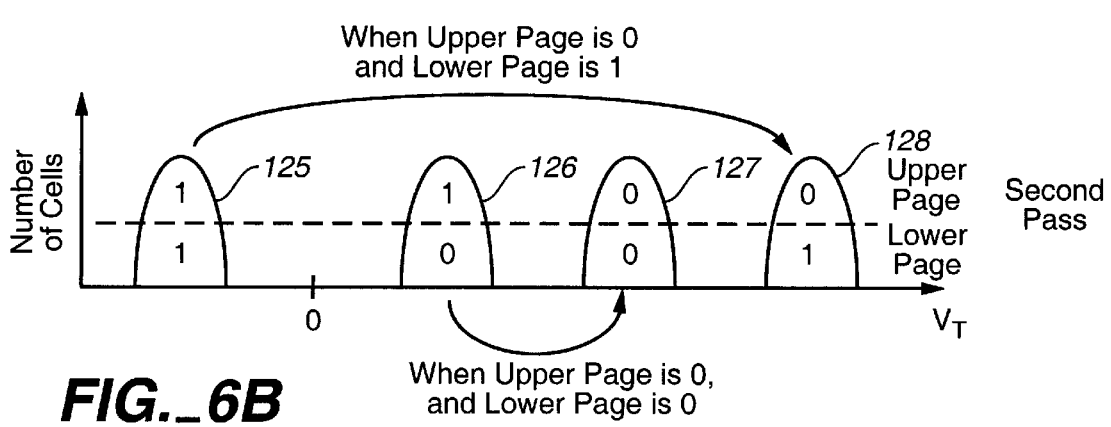
FIG._6B
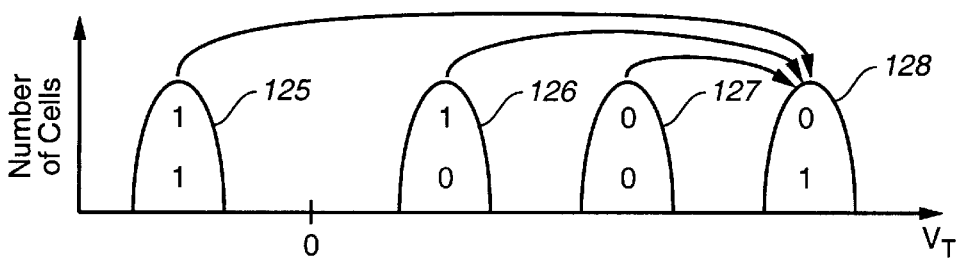
FIG._6C
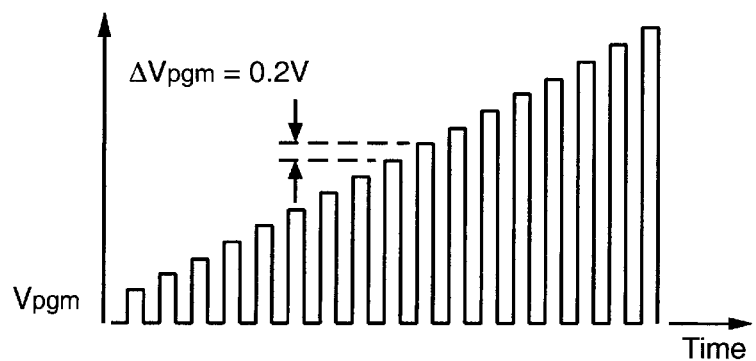
FIG._7

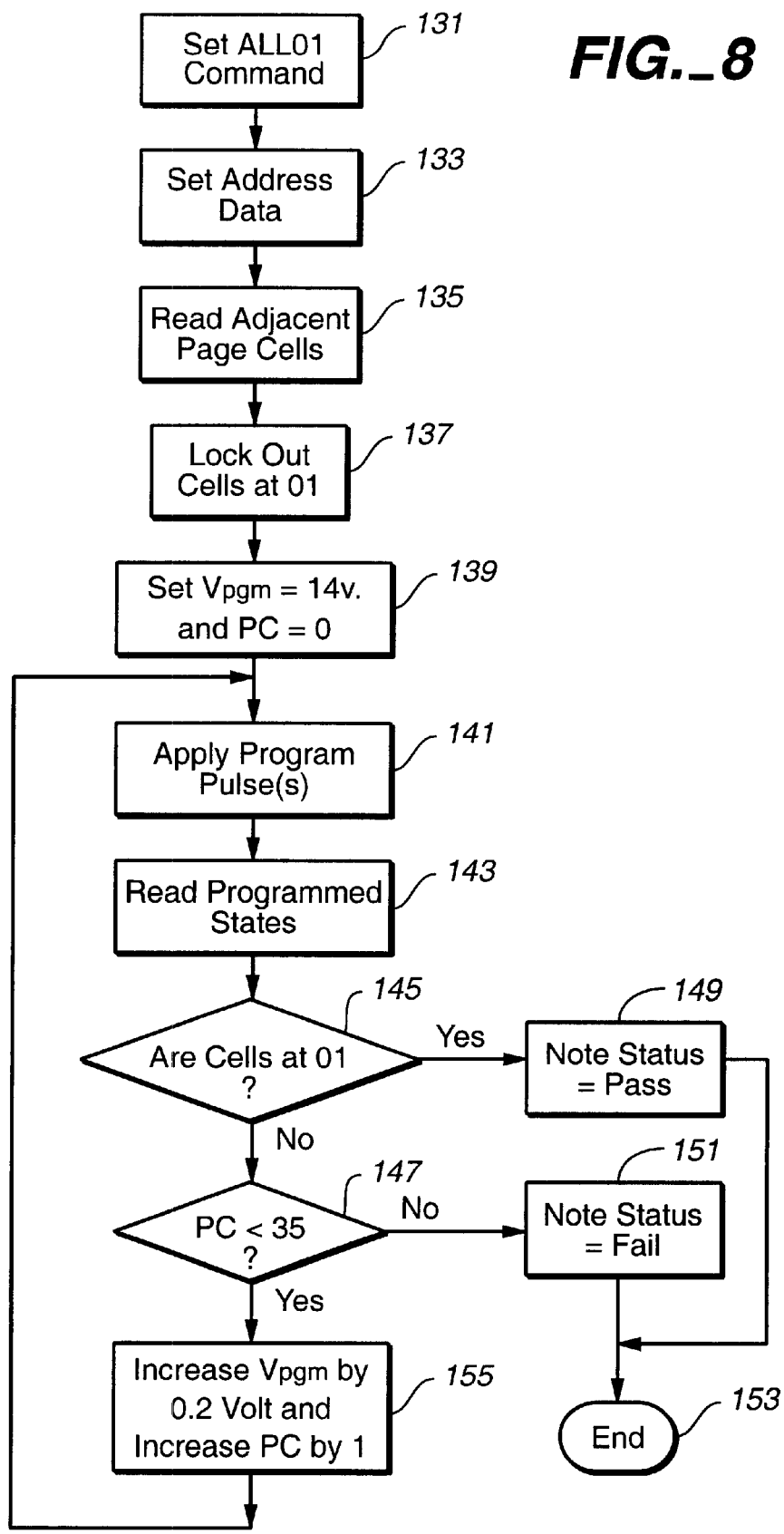
FIG._8

TECHNIQUES OF RECOVERING DATA FROM MEMORY CELLS AFFECTED BY FIELD COUPLING WITH ADJACENT MEMORY CELLS

FIELD OF THE INVENTION

This invention relates generally to the field of data memories, and, more specifically, to memories of the type that store data as levels of electronic charge, including, but not limited to, flash electrically erasable and programmable read-only memories (flash EEPROMs) utilizing either conductive floating gates or dielectric material as charge storage elements.

BACKGROUND OF THE INVENTION

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are contemplated. Each storage element memory transistor has a certain total range (window) of threshold voltages in which it may practically be operated, and that range is divided into the number of states defined for it plus margins between the states to allow for them to be clearly differentiated from one another.

As the number of states stored in each memory cell increases, the tolerance of any shifts in the programmed charge level on the storage elements decreases. Since the ranges of charge designated for each storage stat necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual disturbs to the charge stored in one cell can be created when programming and reading that cell, and when reading, programming and erasing other cells that have some degree of electrical coupling with the that cell, such as those in the same column or row, and those sharing a line or node.

Apparent shifts in the stored charge levels occur because of field coupling between storage elements. The degree of this coupling is necessarily increasing as the sizes of memory cell arrays are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is known as the Yupin effect, and is described in U.S. Pat. No. 5,867,429, which patent is incorporated herein in their entirety by this reference. This patent describes either physically isolating the two groups of storage elements from each other, or taking into account the effect of the charge on the second group of storage elements when reading that of the first group.

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with the sector of user data from which the ECC has been calculated. When this data is read from the memory, the ECC is used to determine the integrity of the user data being read. One or a few erroneous bits of data within a sector of data can often be corrected by use of the ECC but the existence of more errors renders the attempted data read to fail. Thus, the existence of bits that are read incorrectly because of close field coupling with adjacent memory cells can cause an attempted data read to fail.

SUMMARY OF THE INVENTION

In order to be able to recover valid data from a failed read of a first group of memory cells, as determined to have failed by the use of an ECC or otherwise, the data in at least an adjacent second group of memory cells, which are field coupled with the first group being read, are read and written elsewhere, either temporarily or permanently, followed by adjusting the programmed levels of the cells in the second group to that which allows the data originally written in the first group of cells to be accurately read. Ideally, the programmed levels of the second group of memory cells are returned to those existing when the first group of cells was programmed with the data that is now being read. The data is then accurately read from the first group since the fields coupled from the second group of cells are then the same as when the first group was programmed. But since it is often not practical to return the second group to the condition that existed when the first group was programmed, either because that initial condition is not known or for other reasons, the programmed levels of the cells of the second group are alternatively adjusted to a common level, usually the highest programmed level of the memory system.

The present invention can be implemented in various types of flash EEPROM cell arrays. A NOR array of one design has its memory cells connected between adjacent bit (column) lines and control gates connected to word (row) lines. The individual cells contain either one storage element transistor, with or without a select transistor formed in series with it, or two storage element transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663, 901, 5,430,859, 5,657,332, 5,712,180, 5,890,192, 6,091,633, 6,103,573 and 6,151,248, and applications Ser. No. 09/505, 555, filed Feb. 17, 2000, Ser. No. 09/667,344, filed Sep. 22, 2000, Ser. No. 09/925,102, filed Aug. 8, 2001, and Ser. No. 09/925,134, filed Aug. 8, 2001.

A NAND array of one design has a number of memory cells, such as 8, 16 or even 32, connected in a series string between a bit line and a reference potential through select transistors at either end. Word lines are connected with control gates of cells across different series strings. Relevant examples of such arrays and their operation are given in the following U.S. patents and patent application that are incorporated herein in their entirety by this reference: U.S. Pat. Nos. 5,570,315, 5,774,397 and 6,046,935, and application Ser. No. 09/893,277, filed Jun. 27, 2001. Briefly, two bits of data from different logical pages of incoming data are programmed into one of four states of the individual cells in two steps, first programming a cell into one state according to one bit of data and then, if the data makes it necessary, re-programming that cell into another one of its states according to the second bit of incoming data.

The above-referenced patents and patent applications describe flash EEPROM systems that use conductive floating gates as memory cell storage elements. Alternatively, flash EEPROM systems with memory cells employing charge trapping dielectric material in place of floating gates are operated in substantially the same way. Examples of this are included in patent application Ser. No. 10/002,696, filed Oct. 31, 2001, by Harari et al., entitled "Multi-State Non-Volatile Integrated Circuit Memory Systems that Employ Dielectric Storage Elements," which application is incorporated herein by this reference. Field coupling between dielectric storage elements of adjacent memory cells can also affect the accuracy of the data read from such memory systems.

Additional aspects, features and advantages of the present invention can be had from the following detailed description of exemplary embodiments thereof, which description should be read along with reference to the accompanying drawings.

BRIEF DESCRIPTION OF THE DRAWINGS

FIG. 1 schematically illustrates an example memory system and operation in which the present invention may be implemented;

FIG. 2 is an example, in plan view, of storage elements of memory cells within the array of memory cells of the system of FIG. 1;

FIGS. 3A and 3B are curves of programmed memory cell level distributions that illustrate one application of the present invention.

FIG. 4 is a flow chart that provides one example of the operation of the memory system of FIGS. 1–3B;

FIGS. 5A, 5B and 5C illustrate exemplary structures and operation of three types of memory cell arrays in which the present invention may be implemented;

FIGS. 6A and 6B show one technique for programming data into a particular type of existing non-volatile memory cell array;

FIG. 6C illustrates another programming technique that is carried out as part of the special operation illustrated in FIG. 8;

FIG. 7 illustrates one format of repetitive programming pulses used to program non-volatile memory cells, which may be used with the programming illustrated in FIGS. 6A, 6B and 6C; and FIG. 8 is a flow chart showing a special operation of the particular type of existing non-volatile memory cell array whose normal data programming is illustrated in FIGS. 6A and 6B.

DETAILED DESCRIPTION OF EXEMPLARY EMBODIMENTS

In order to explain the present invention and example implementations, a general diagram of the interrelationship of major components of an example mass memory system is shown in FIG. 1. A primary component of this system is a memory 11, such as an array of memory cells formed on a semiconductor substrate, wherein one or more bits of data are stored in the individual memory cells by storing one of two or more levels of charge on individual storage elements of the memory cells. A non-volatile flash EEPROM is a common type of memory for such systems, and is used in this example.

A second primary component of the memory system of FIG. 1 is a controller 13. The controller 13 communicates over a bus 15 to a host computer or other system that is using the memory system to store data. The controller 13 also controls operation of the memory cell array 11 to write data provided by the host, read data requested by the host and perform various housekeeping functions in operating the memory. The controller 13 normally includes a general purpose microprocessor, with associated nonvolatile software memory, various logic circuits, and the like. One or more state machines are often also included for controlling the performance of specific routines.

The memory cell array 11 is addressed by the controller 13 through address decoders 17. The decoders 17 apply the correct voltages to gate and bit lines of the array 11 in order to program data to, read data from, or erase a group of memory cells being addressed by the controller 13. Additional circuits 19 include programming drivers that control voltages applied to elements of the array that depend upon the data being programmed into an addressed group of cells. The circuits 19 also include sense amplifiers and other circuits necessary to read data from an addressed group of memory cells. Various specific forms of the circuits 17 and 19 are described in the patents and patent applications identified in the previous Background section. Data to be programmed into the array, or data recently read from the array, are typically stored in a buffer memory 21 within the controller 13. The controller 13 also usually contains various registers for temporarily storing command and status data, and the like.

The array 11 is divided into a large number of BLOCKS 0–N of memory cells. As is common for flash EEPROM systems, the block is the unit of erase. That is, each block contains the minimum number of memory cells that are erased together. Each block is typically divided into a number of pages, as also illustrated in FIG. 1. A page is the unit of programming. That is, a basic programming operation writes data into a minimum of one page of cells. One or more sectors of data are stored within each page. As shown in FIG. 1, one sector includes user data and overhead data. Overhead data typically includes an ECC that has been calculated from the user data of the sector. A portion 23 of the controller 13 calculates the ECC when data is being programmed into the array 11, and also checks it when data is being read from the array 11. Alternatively, the ECCs are stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from 8 pages, for example, up to 512, 1024 or more pages. The number of blocks is chosen to provide a desired data storage capacity for the memory system. The array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which patent is incorporated herein by this reference.

FIG. 2 shows an arrangement of storage elements (squares) in an array of memory cells in order to illustrate the capacitive coupling (dashed lines) between rows of them. Considering a storage element 25 of a row 35, for example, it is field coupled to storage elements in each of the adjacent rows 37 and 39. The storage element 25 is most closely coupled with the storage elements 27 and 31, because of their proximity, but also have a lesser degree of coupling with storage elements 26, 28, 32 and 30 that are further away. The amount of coupling between two storage elements depends upon the distance between them, the dielectric constant of insulating material between them, whether there are any conductive surfaces between them, and the like.

Although FIG. 2 illustrates only field coupling between rows of storage elements, such coupling also exists between columns of storage elements. This is not being considered in the examples being described herein because, in these examples, data is programmed into memory cells in units of individual rows, the coupling between the rows has been found to be the cause of the apparent shift in programmed levels. For example, if data are programmed as distinct charge levels on the storage elements of the row 35, a later change in the charge levels on either or both of the adjacent rows 37 and 39 will cause a shift in the apparent charge levels that are then read from the storage elements of the row 35. The amount of such a shift in the apparent charge level read from a particular storage element of the row 35 depends upon the degree of coupling with other storage elements whose charge was later changed in level and the amount of that change. When the later change is caused by programming data into the adjacent row, the amounts of the shifts that result are unknown unless the patterns of data programmed into each row are monitored and calculations of their effect made as part of each read operation.

FIG. 3A shows an example of the effect upon a first group of memory cells, such as a row of cells, of the later programming of a second group of memory cells, such as an adjacent row of cells. In this example, four distinct charge levels are defined for each storage element, thereby to store two bits of data on each storage element. Since the level of charge stored on a storage element changes the threshold voltage (VT) of its memory cell transistor, the threshold voltage is shown on the horizontal axis of the curves of FIG. 3A. The solid lines show the distributions of the number of threshold voltages of all the cells in a page immediately after being programmed, before any change is made to the adjacent pages. The vertical axis is the number of cells at each threshold level, the curves having essentially a Gaussian distribution. A curve 45 is the distribution of the cells in the erased state, which, in this example, is also designated as a programmed state of the bits 11. When a block of cells is erased, the cells are reset to the 11 state.

Each cell of a page being programmed to one of the other programmed states 47, 49 or 51 has electrons injected onto its storage element until its threshold reaches the state corresponding respectively to the data 01, 00 or 01 being programmed into the cell. Suitable programming techniques are described in other patents identified above in the Background. Briefly, cells of a page being programmed are programmed in parallel with chunks of data that are a fraction of the capacity of the page or, if the array and system allow, the entire page. Those being programmed into the 10 state are alternately pulsed with programming voltages and then verified by use of a read threshold level $V_{10}$. When it is determined that a cell has been programmed to a threshold level above $V_{10}$, programming stops as to that cell but continues for other cells that have not yet reach their verify level. If being programmed to 00, a verify level $V_{00}$ is used. If to 01, a verify level $V_{01}$ is used. The particular data bit pair assigned to each of the distributions 45, 47, 49 and 51 may be different that shown in FIG. 3A, and may even be rotated during operation of the memory system in order to even out wear on the array.

It is desired to maintain a sufficient margin between the states 45, 47, 49 and 51 so that the state of each cell can be unambiguously read. When a page of cells programmed as described above are to be read, their states are individually compared to reference threshold levels within the margins between these states. These are shown in the example of FIG. 3A as $R_{10}$ ($V_T$=0), $R_{00}$ and $R_{01}$. Of course, in order to be able to fully use an available threshold window, as many different states are included as is practical, four states being shown. Another example is sixteen states. A larger number of states can result from the width of the distributions being narrowed by programming with smaller voltage increments in successive pulses but this then takes more time to perform the programming. It is therefore desirable, either alone or along with narrowing the programmed cell distributions, to take steps to reduce the need for such large margins between states. Rather large margins are usually maintained in order to allow for the programmed cell distributions to shift or spread as a result of repetitive operating cycles that occur after the programming, as experience has shown to occur. It is highly desirable to reduce such shifting and spreading in order to be able to reduce the amount width of the margins between states.

The spreading of the distributions that occurs as the result of subsequently programming an adjacent row of cells is shown in dashed lines in FIG. 3A. Even when significant margins are maintained during the initial programming of a row of cells, these margins can be significantly narrowed when the distributions spread as a result of later programming an adjacent row of cells. If just a few of the cells spread from below to above one of the reading thresholds $R_{10}$, $R_{00}$ and/or $R_{01}$, there can be enough erroneous readings to overwhelm an ECC. In such a case, the data cannot be read with those thresholds, so are designated as invalid unless some corrective action is taken. One corrective technique used in the past is to read the page again by simply moving the reading threshold levels $R_{10}$, $R_{00}$ and/or $R_{01}$ within the margins to avoid the effect of the spreading. Since the spreading can come from both sides of each margin, this requires that the margins be maintained wider than is normally desired in order to prevent the distributions of adjacent states from overlapping. It is thus preferable to take some other action to recover the data, in such a circumstance, that does not require maintaining wide margins between the programmed states.

The programmed distributions appear to spread in the manner shown in FIG. 3A when the data subsequently programmed into the adjacent page is random; that is, when the state stored in each storage element can be any of the four possible states. A storage element programmed to a level at the lower edge of the distribution 47, for example, will be read to have the same level in the distribution 47' if the charge level on adjacent storage elements does not change during the subsequent programming. On the other hand, a storage element initially programmed to a level at the upper edge of the distribution 47 will, if the adjacent storage elements are subsequently programmed from an erased state 11 to the highest state 01, be read to have a level that is increased by an amount $\Delta$. The higher charge levels on the adjacent storage elements are coupled with the previously programmed storage element whose level is being read. Other combinations of initial and later programming of adjacent cells of the distribution 47 fall between these two extremes, thereby resulting in the apparent distribution 47'. The lower end of the apparent distribution 47' remains at the same level but its spread is increased by $\Delta$.

If the data read from the initial row is invalid, a heroic process takes place to recover the data. The system is designed to have sufficient margins so that this does not occur very often but, at the same time, to provide a technique to handle it when necessary, thus avoiding the need to make the margins so wide that this condition never occurs. The recovery process involves changing the charge levels on the later programmed page. If the memory array is of a type having only one page per block, the subsequently programmed block can be erased (after reading its data and writing it in another location, of course). This returns the adjacent page of cells to their condition when the problematic page was initially programmed. That initial page will then exhibit the original distributions 45, 47, 49 and 51 and should then be readable with the same read reference levels. At least the effect of the later programming of the adjacent page has been removed.

However, most flash EEPROM systems are of the type illustrated in FIG. 1, where a block contains a large number of pages. The later programmed page cannot then be erased without erasing all other pages of the block. Therefore, in such a case, charge is added to the storage elements of the later written page that are not already in the highest state by further programming until they are all in the highest threshold state. The result on the originally programmed page is shown in FIG. 3B, where the apparent distributions are tightened. The upper end of the distribution 47", for example, remains the same as that of the distribution 47' of FIG. 3A, while the lower end is moved upward by approximately $\Delta$. Every storage element of the originally programmed page is pulled up by the influence of the high charge level of the storage elements of the other page. The originally programmed page is then read with thresholds that are also shifted by $\Delta$, the same amount that the apparent distributions 45", 47", 49" and 51" have been shifted from the respective original distributions 45, 47, 49 and 51. The new read threshold levels are $R_{10}+\Delta$, $R_{00}+\Delta$ and $R_{01}+\Delta$, as shown on FIG. 3B.

The reading process for a page of data is outlined by the flow chart of FIG. 4. A first step 55 is to read the user data and its stored ECC in a normal manner. This can be, for example, a page formed by the row 37 of memory cells illustrated in FIG. 2. The read data is then compared with the ECC, in a step 57. If there are no errors in the data, as determined by comparison with the ECC, as indicated by the step 59, the read data is sent to the host, as shown by a step 65. This is the process that is followed for most all reads. In other cases, where one or more bit errors in the read data are present, the errors may be correctable, as determined by a step 61. If so, the read data is corrected, in a step 63, and the corrected data than sent to the host, through step 65. Almost all of the pages read in a useful system will follow this process.

But for the rare occasion where the data is determined by the step 61 to not be correctable, the extra steps described above are taken. The charge levels of a next adjacent page, such as the page formed by the row 35 of FIG. 2, are then adjusted to the highest programmed level. A first step 67 of this process is to read the data from that next page. If there are no errors in the data, as determined by steps 69 and 71, or if there are errors that are correctable, as accomplished by steps 73 and 75, this read data is stored elsewhere, as indicated by a step 79. The page of data can be directly written to another page in the memory cell array, or can first be temporarily stored in the controller memory 21 for later writing back into the array. After a copy of the data of the page 35 is safely stored somewhere, the charge levels of the storage elements of that page are increased to a common level, most conveniently to the maximum threshold level of a normal programming operation. This is indicated by a step 81. Those storage elements within the page 35 that are already at that level are not further programmed, and the others are subjected to the usual program/verify cycles until each storage element contains the maximum charge (the threshold level 01 is reached). This can be done by the system's normal programming operation but, of course, user data is not being programmed. All memory cell transistors are programmed to the highest 01 state.

Thereafter, as indicated by a step 83, the page 37 is again read with the higher read threshold levels, as previously explained with respect to FIG. 3B. This read data is then subjected to an ECC check, as indicated by the steps 85, 87, 89 and 91. If there are no errors in the data, or if any errors can be corrected, the read data are sent to the host by the step 65. The data recovery process has then been a success. On the other hand, if the data read by the step 83 has too many errors to be used, then the address of the page that cannot be read is stored, as indicated by the step 93. The attempted data recovery process is then ended. Unless there is some other alternate technique that is available for trying to recover the data, that page of data cannot be returned to the host. The system and this recovery process are designed, however, for such an absolute failure to seldom, if ever, result from the field coupling between adjacent pages of the memory array.

If, at step 73, it is determined that the data read from the next page 35 is not free of errors and is not correctable, a next step 77 is to store the address of the failed page and then return to the step 67 for the next page in physical proximity to the page 37, the page 39 of FIG. 2 being this page. What this determines is that both of the pages 37 and 35 require the process of to be applied to recover data from them. The step 81 is then applied to the next page 39, in proximity to the pages 37 and 35. At a step 95, the data reading steps 83–91 are then caused to be repeated for the second failed page 35. If there are more than two failed pages in succession, the process steps through each until valid data is read from a page.

FIG. 5A illustrates the sequence in which rows of memory cells are programmed according to one technique that is used in at least one commercial NAND array. Each row of an erased block is programmed in sequence, one after the other, wherein one row includes one or more pages of the memory. The details of the data recovery described above with respect to FIGS. 2–4 apply to this type of memory. Since the order of programming of the rows of the pages are known, the row written after the failed read of a row is known. It is that subsequently written row that is written to the higher state in order to recover data of the failed read row. For example, if valid data cannot be read from the row 101, it is the cells of the subsequently programmed row 103 that are programmed to their highest states. Data is then read from the row 101, more likely now to be valid data. The adjacent row 105 on the other side of the failed read page need not be considered since its data were written before that of the row 101, so the data levels stored in the row 105 have not changed the apparent data levels read from the row 101.

In other types of memory systems, however, this order of programming rows is not a constraint. Referring to FIG. 5B, for example, it is shown that rows within a block are programmed in an order that is independent of their relative positions. For example, a row 105 is first programmed, followed by rows 107, 109, 111, 113 and 115, in that order. But during a read operation of the pages formed by these rows, the order of their programming may not be known. For example, if data read from the row 107 are not valid and cannot be corrected by the ECC, it may not be known which of the adjacent rows 105 and 109 was later programmed and thus a likely cause of the error in reading the row 107. If this is not known, both adjacent rows 105 and 109 are reprogrammed to their highest states before again reading data from the row 107. If the order is known, of course, only the adjacent row that was later programmed is treated in this way. In this case, the row 109 would be so treated while the row 107 would not. The order can be known, for example, by maintaining a time stamp or programming order number as part of the overhead data associated with the individual sectors of user data.

A couple of interesting things about the particular example shown in FIG. 5B may be noted. If invalid data is initially read from the row 105, which was the first to be programmed in the block, the levels of the cells of the rows 107 and 113 on both sides of the row 105 would need to be raised to their highest levels, since they have both been programmed with user data after programming the row 105. Fields from one or both of the rows 107 and 113 can be causing the invalid read of the row 105, so they both need to be raised in level. Further, if invalid data is initially read from the row 113, the fields created from the adjacent rows 105 and 111 are likely not the cause of the error because the row 113 was programmed before either of its adjacent rows. In such a case, the recovery process can be avoided and the data in the row 113 marked as invalid.

FIG. 5C illustrates another array architecture in which the data recovery process being described may be implemented. One specific example of this architecture is described in U.S. Pat. No. 5,579,259, which patent is incorporated herein by this reference. Memory cells within two adjacent rows 117 and 119 form a block, in that the cells of both rows are erased from a common erase gate line 121. The capacity of the block is one up to many sectors of data but the block is also the unit of programming. This structure of a pair of memory cell rows with an intermediate erase gate is repeated across the array. When invalid data is read from one such block, the recovery process herein is applied to an adjacent block that was subsequently programmed, or, if it is not known which adjacent block was programmed later, to both of the blocks adjacent the block from which invalid data has been read, on either side.

FIGS. 6A and 6B demonstrate an existing programming technique that is employed with a particular NAND system discussed in the Background above, in connection with patents and a patent application there incorporated by reference. They illustrate threshold voltage distributions for the memory cell array when each storage element stores two bits of data, namely four data states, similar to illustration of FIGS. 3A and 3B. The curve 125 represents a distribution of the threshold levels $V_T$ of the cells within the array that are in the erased state ("11" data state), being negative threshold voltage levels. Threshold voltage distributions 126 and 127 of memory cells storing "10" and "00" user data, respectively, are between 0 volts and 1 volt and between 1 volts and 2 volts. A curve 128 shows the distribution of cells that have been programmed to the "01" data state, being the highest threshold voltage level, set more than 2 volts and less than 4.5 volts.

Each of the two bits stored in a single memory cell, in this example, is from a different logical page. That is, each bit of the two bits stored in each memory cell carries a different logical page address from each other. The lower bit shown is accessed when a lower page address is input. The upper bit shown is accessed when an upper page address is input.

FIGS. 6A and 6B also illustrate the specific existing technique used to program a 4-state NAND memory cell in an array of the type described above. In a first programming pass, the cell's threshold level is set according to the bit from the lower logical page. If that bit is a "1", nothing is done since it is in that state as a result of having been earlier erased. However, if that bit is a "0", the level of the cell is increased to the first programmed state 126. That concludes the first programming pass.

In a second programming pass, the cell's threshold level is set according to the bit being stored in the cell from the upper logical page. If a "1", no programming occurs since the cell is in one of the states 125 or 126, depending upon the programming of the lower page bit, both of which carry an upper page bit of "1". If the upper page bit is a "0", however, the cell is programmed a second time. If the first pass resulted in the cell remaining in the erased state 125, the cell is programmed from that state to the highest most state 128, as shown by the upper arrow FIG. 6B. If the cell has been programmed into the state 126, however, as a result of the first programming pass, the cell is further programmed in the second pass from that state to the state 127, as shown by the lower arrow of FIG. 6B. The result of the second pass is to program the cell into the state designated to store a "0" from the upper page without changing the result of the first pass programming.

Of course, if the memory is operated with more than four states, there will be a number of distributions within the defined voltage threshold window of the memory cells that is equal to the number of states. Further, although specific bit patterns have been assigned to each of the distributions, different bit patterns may be so assigned, in which case the states between which programming occurs can be different than those shown in FIGS. 6A and 6B. A few such variations are discussed in the patents previously referenced in the Background.

A typical programming voltage Vpgm waveform is illustrated in FIG. 7. The programming voltage Vpgm is divided into many pulses, and increased 0.2 volt pulse-by-pulse. The Vpgm step size is 0.2 volt. The maximum width of the resulting distribution is thus 0.2 volt.

In periods between the pluses, the program verify operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, Vpgm is removed by raising the voltage of the bit line to which the series cell unit of the given cell is connected from 0 volts to Vdd. Programming of others of the cells being programmed in parallel continues until they in turn reach their verify levels.

With the specific NAND system operation described with respect to FIGS. 6A, 6B and 7, the normal programming operation does not allow all the cells of a page to be increased to the highest level 128 when the recovery of data from an adjacent page is taking place. For a cell in the state 127, there is no standard programming operation to move the threshold level $V_T$ of the cell to the highest state 128. Therefore, in order to be able to move all cells of any page to the highest level 128 as part of recovering data from an adjacent page, another programming-like operation is added. This additional operation, initiated in response to an "ALL01" command, is shown in the flow chart of FIG. 8.

First, the system programming algorithm is set (131) to execute the ALL01 command, following by an act 133 of setting the address of the page whose memory cells are to have there threshold voltages raised to the 01 programmed state. Next, the data stored in the cells of the addressed page are read (135), followed by locking out all of those cells that are already in the 01 state (137). That is, none of the cells of the page in the 01 state are to receive programming voltages. For the remaining cells that are in other than the highest 01 state 128, a programming voltage Vpgm is set at 14 volts, in this specific example, and a pulse counter ("PC") is set to 0, as shown at 139.

The operation then follows a loop beginning with the application of one programming or more pulses (141), followed by reading the states of the cells being programmed (143). If any cells have reached the 01 state, as indicated by 145, they are noted to have passed (149) and further programming of them is locked out. But if some of theses cells are not yet in the 01 state, the process continues to a determination (147) of whether a certain maximum number of programming pulses, in this case 35, have been applied. If so, it is noted (151) that the process has failed as to the cells not in the 01 state, and the process is ended (153). If fewer than 35 programming pulses have been applied, however, the programming voltage Vpgm is increased by 0.2 volt and the pulse counter incremented by one (155). The programming cycle of acts 141–155 is then repeated. In the usual case, the process ends (153) when all the cells of the page have been programmed to the 01 state. FIG. 6C illustrates this method of programming the memory cells of the addressed page to the highest state 128. Data in the adjacent page that was first read to be invalid is now read again in order to recover that data, as described above.

Although the present invention has been described with respect to exemplary embodiments, it will be understood that the invention is entitled to protection within the full scope of the appended claims.

It is claimed:

1. A method of reading multiple bits of data stored as different ones of a plurality of levels of charge in storage elements of individual memory cells of a first group, wherein the data read is corrupted by other data stored as different ones of the plurality of levels of charge in storage elements of adjacent memory cells of a second group to which the storage elements of the cells of the first group are field coupled, comprising:

reading the charge levels stored in the storage elements of the second group of memory cells, thereby to read the data stored in the second group of memory cells, storing the data read from the storage elements of the second group of memory cells in a location outside of the first or second group of memory cells, thereafter altering the levels of charge stored in the individual storage elements of the memory cells of the second group, thereby to alter apparent levels of charge read from the storage elements of the first group of memory cells, and thereafter reading the charge levels stored in the storage elements of the first group of memory cells, thereby to read the data stored in the storage elements of the first group of memory cells with altered charge levels stored in the storage elements of the second group of cells.

2. The method of claim 1, wherein altering the levels of charge stored in the storage elements of the individual memory cells of the second group includes setting the levels of charge stored in the individual storage elements of the memory cells of the second group to a common level of charge.

3. The method of claim 2, wherein said common level of charge is the highest of the plurality of levels of charge by which data is stored the storage elements of the memory cells of the first group.

4. The method of claim 3, wherein the plurality of levels of charge stored in the individual storage elements of the memory cells is greater than two levels of charge, thereby to store more than one bit of data in the individual storage elements.

5. The method of claim 1, wherein the plurality of levels of charge stored in the individual storage elements of the memory cells is exactly two levels of charge, thereby to store exactly one bit of data in the individual storage elements.

6. The method of claim 1, wherein charge levels are initially stored in the storage elements of the first group and then the second group, in sequence.

7. The method of claim 6, wherein the method is practiced on the first and second groups of memory cells as part of a NAND array of memory cells.

8. The method of claim 1, wherein the method is practiced on the first and second groups of memory cells as part of a NOR array of memory cells having a single storage element per memory cell.

9. The method of claim 1, wherein the method is practiced on the first and second groups of memory cells as part of a NOR array of memory cells having two storage elements per memory cell.

10. The method of claim 1, wherein the first and second groups of memory cells are part of an array of non-volatile memory cells wherein the storage elements are conductive floating gates.

11. The method of claim 1, wherein the first and second groups of memory cells are part of an array of non-volatile memory cells wherein the storage elements are defined areas of a dielectric.

12. A method of reading data stored as different ones of a plurality of levels of charge in individual storage elements of memory cells in an array of memory cells that includes at least first and second groups of memory cells having charge levels of their storage elements field coupled with each other, comprising:

reading the charge levels stored in the storage elements of a first group of memory cells with use of a first set of reference levels, thereby to provide a reading of the data stored in the storage elements of the first group of memory cells, determining whether or not the data read from the storage elements of the first group of memory cells are valid, if the data read from the storage elements of the first group of memory cells is determined not to be valid, reading the charge levels stored in the storage elements of the second group of memory cells, thereby to provide a reading of the data stored in the second group of memory cells, storing the data read from the second group of memory cells, thereafter altering the levels of charge stored in the individual storage elements of the memory cells of the second group, thereby to alter apparent levels of charge stored in the storage elements of the first group of memory cells due to the field coupling therebetween, and thereafter reading the charge levels stored in the storage elements of the first group of memory cells with use of a second set of reference levels different from the first set of reference levels, thereby to provide a reading of the data stored in the first group of memory cells that is compensated for the effects of the field coupling between the storage elements of the first and second groups of memory cells.

13. The method of claim 12, wherein altering the levels of charge stored in the individual storage elements of the memory cells of the second group includes setting the levels of charge stored in the individual storage elements of the memory cells of the second group to a common level that is at least as high as the highest of the plurality of levels of charge by which data is stored in the storage elements of the memory cells of the first group.

14. The method of claim 13, wherein the second set of reference levels are higher than the first set of reference levels.

15. The method of claim 14, wherein the plurality of levels of charge stored in the individual storage elements of the memory cells is greater than two levels of charge, thereby to store more than one bit of data in the individual storage elements.

16. The method of claim 12, wherein determining whether or not the data read from the storage elements of the first group of memory cells are valid includes using an error correction code stored when programming the data of the first group of memory cells.

17. The method of claim 16, wherein the plurality of levels of charge stored in the individual storage elements of the memory cells is greater than two levels of charge, thereby to store more than one bit of data in the individual storage elements.

18. The method of claim 12, wherein the plurality of levels of charge stored in the individual storage elements of the memory cells is greater than two levels of charge, thereby to store more than one bit of data in the individual storage elements.

19. The method of claim 18, wherein the memory cells in the array of memory cells are flash EEPROM cells.

20. The method of claim 12, wherein the method is practiced in an array of memory cells wherein the first and second groups of cells include respective first and second adjacent rows of cells.

21. In a flash non-volatile memory system including an array of memory cells connected in NAND strings to form columns and having word lines extending across the columns over rows of cells, wherein adjacent rows are capacitively coupled with each other and programmed in a fixed sequence by increasing the charge levels stored in the individual cells to one of four or more charge levels in a first programming step and to one of at least the highest two or more charge levels in a second programming step, a method of reconstructing data stored in a first row that is read as invalid on account of data subsequently stored in an adjacent second row, comprising:

reading the charge levels stored in the cells of the second row and writing the data represented thereby to another location within the memory system, thereafter increasing the charge levels of the individual cells of the second row from their programmed levels to the highest programming charge level, and thereafter reading the charge levels stored in the cells of the first row.

22. The method of claim 21, wherein the method is practiced in a memory system whose memory cells store the charge levels in conductive floating gates.

23. The method of claim 21, wherein the method is practiced in a memory system whose memory cells store the charge levels in a dielectric.

* * * * *